(12) United States Patent
Cheng et al.

(10) Patent No.: US 10,955,741 B2
(45) Date of Patent: Mar. 23, 2021

(54) RETICLE CLEANING SYSTEM AND METHOD FOR USING THE SAME

(71) Applicant: TAIWAN SEMICONDUCTOR MANUFACTURING CO., LTD., Hsinchu (TW)

(72) Inventors: Wei-Chang Cheng, Taichung (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/172,075

(22) Filed: Oct. 26, 2018

(65) Prior Publication Data
US 2020/0057367 A1 Feb. 20, 2020

Related U.S. Application Data

(60) Provisional application No. 62/718,948, filed on Aug. 14, 2018.

(51) Int. Cl.
| | |
|---|---|
| *B08B 3/10* | (2006.01) |
| *G03F 1/82* | (2012.01) |
| *G01R 29/12* | (2006.01) |
| *B08B 3/04* | (2006.01) |

(52) U.S. Cl.
CPC ............... *G03F 1/82* (2013.01); *B08B 3/04* (2013.01); *B08B 3/041* (2013.01); *G01R 29/12* (2013.01)

(58) Field of Classification Search
None
See application file for complete search history.

(56) References Cited

U.S. PATENT DOCUMENTS

| | | | |
|---|---|---|---|
| 6,741,445 B1* | 5/2004 | Phan | H01L 21/67253 361/230 |
| 2006/0182882 A1* | 8/2006 | Takahashi | G11B 7/266 427/240 |
| 2009/0038988 A1* | 2/2009 | Lin | H01L 21/67359 206/723 |
| 2015/0133032 A1* | 5/2015 | Kubo | H01L 21/30625 451/5 |
| 2017/0110355 A1* | 4/2017 | Numanami | H01L 21/67051 |
| 2017/0139322 A1 | 5/2017 | Shen et al. | |

FOREIGN PATENT DOCUMENTS

| | | |
|---|---|---|
| CN | 102649119 A | 8/2012 |
| TW | 201539111 A | 10/2015 |
| TW | 201624107 A | 7/2016 |

* cited by examiner

*Primary Examiner* — Mikhail Kornakov
*Assistant Examiner* — Ryan L. Coleman
(74) *Attorney, Agent, or Firm* — Maschoff Brennan (57) ABSTRACT

A method for cleaning a reticle includes rotating the reticle, providing a cleaning liquid to clean the reticle, detecting a static charge value on the reticle during rotating the reticle, and reducing static charges on the reticle in response to the detected static charge value. Hence, the electrostatic discharge (ESD) occurred to the reticle can be prevented.

20 Claims, 5 Drawing Sheets

RETICLE CLEANING SYSTEM AND METHOD FOR USING THE SAME

PRIORITY CLAIM AND CROSS-REFERENCE

This application claims priority to U.S. provisional application Ser. No. 62/718,948, filed on Aug. 14, 2018, which is hereby incorporated by reference in its entirety.

BACKGROUND

As the semiconductor integrated circuit (IC) industry keeps progressing towards manufacturing more sophisticated and minute semiconductor device, the amount of electronic elements in each semiconductor is drastically increased while the size thereof is conversely decreased. This scaling down process substantially provides a variety of benefits including improving production efficiency and lowering manufacturing costs. However, the increases of manufacturing complexity and difficulty have also come with these benefits. For example, even a tiny defect on masks or reticles, which are commonly used for photolithography process in the semiconductor manufacturing, may result in a noticeable deterioration to the performance of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about", "substantially" or "approximately" shall generally mean within 20 percent, within 10 percent, or within 5 percent of a given value or range. Numerical quantities given herein are approximate, meaning that the term "around", "about", "substantially" or "approximately" can be inferred if not expressly stated.

As the semiconductor device keeps scaling down, patterns on masks or reticles used in lithography processes for manufacturing the semiconductor device becomes more complicated as well. Hence, even a tiny defect to the patterns on the reticles may result in a noticeable deterioration to the performance of the semiconductor device. Due to the diligence in researching on the cause of the defect to the patterns, it is found that the patterns on the reticles may be damaged during the cleaning processes applied thereto. More specifically, the electrostatic discharge (ESD) occurred to the reticles may be blamed for damaging the patterns thereon. Regarding the cleaning processes, a variety of fluids, such as the deionized water (DIW) and other suitable aqueous solutions, may be positioned on the used reticle while the used reticle is simultaneously rotated. Hence, the friction occurred between the fluid and the reticle during the cleaning processes may result in static charges accumulated on the reticles, such that the ESD may subsequently happen to the reticle and damage the patterns thereon. Among the reticle cleaning processes, the ESD is most likely to occur in the spin dry process as described below. During the spin dry process, the reticle is quickly rotated, such that the cleaning fluid on the reticle moves toward edges of the reticle and is eventually spattered out of the reticle due to the centrifugal force. The quick movement of the cleaning fluid may generate static charges on the reticle. Additionally, the static charges are more likely to accumulate in a dry condition as that during the spin dry process. Consequently, a reticle cleaning system with static charge detecting and removing functions and a method for controlling a reticle cleaning system with static charge detecting and removing functions are presented hereinafter in accordance with various embodiments of the present disclosure, so as to remove static charges on the reticle and reduce ESD.

Figure 1:
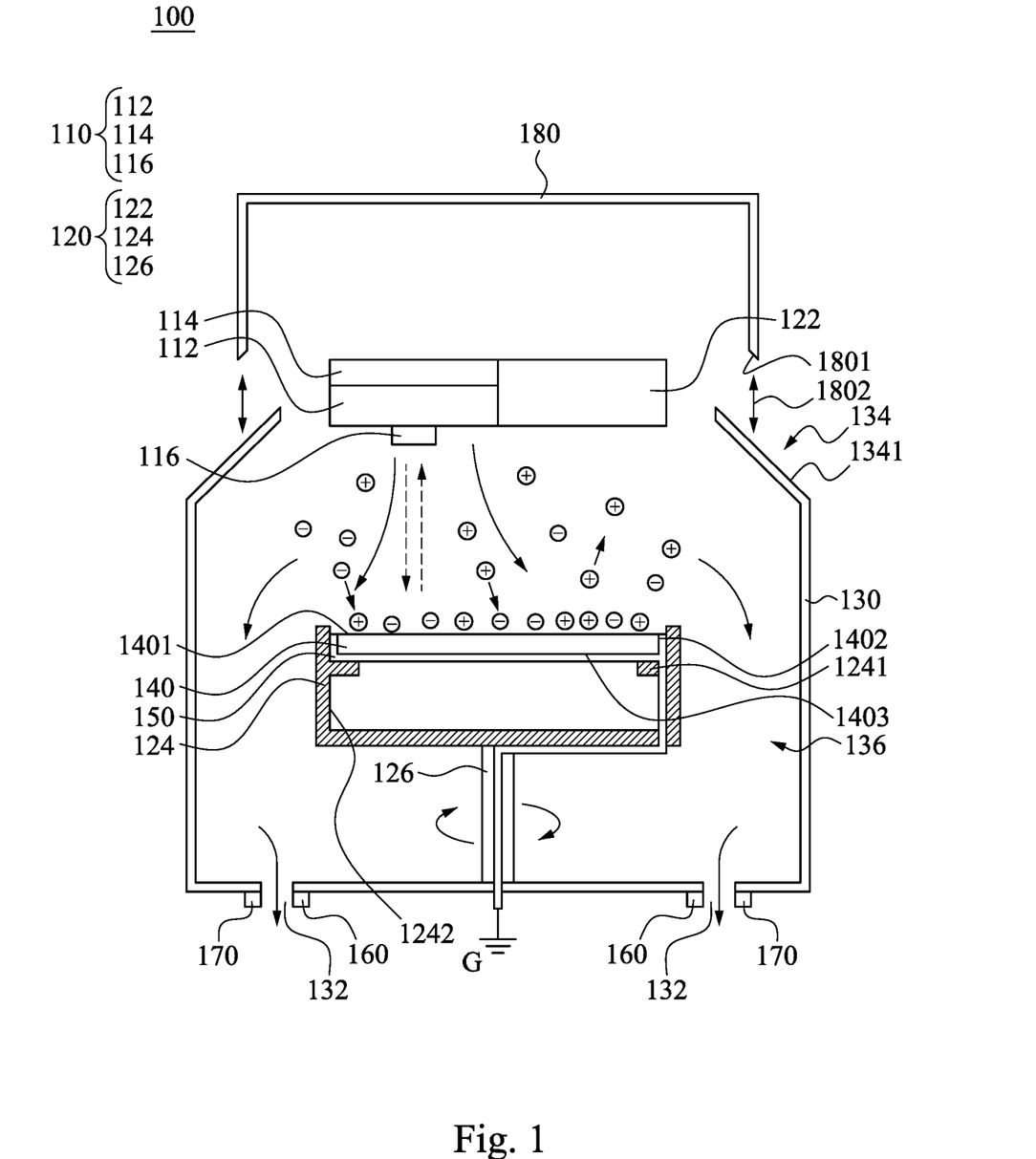
FIG. 1 is a schematic diagram illustrating a front-view of a reticle cleaning system with static charge detecting and removing functions in accordance with some embodiments of the present disclosure.

Reference is made to FIG. 1, which is a schematic diagram illustrating a front-view of a reticle cleaning system 100 in accordance with some embodiments of the present disclosure. As shown in FIG. 1, the reticle cleaning system 100 includes a static charge reducing device 110, a reticle cleaning device 120, and a casing 130. The static charge reducing device 110 includes an ionizer 112, a fluid generator 114, and a static charge sensor 116. The ionizer 112 is configured to produce ionized air molecules, i.e., positive air ions, negative air ions, or a combination thereof. The static charge sensor 116 is communicated with the ionizer 112 and the fluid generator 114. For example, the static charge sensor 116 may inform the ionizer 112 and/or the fluid generator 114 after determining that a static charge value on the reticle 140 is out of a predetermined range. The reticle cleaning device 120 includes a liquid injector 122, a reticle holder 124, and a spinner 126. The liquid injector 122 is configured to inject a liquid onto the reticle 140. The reticle holder 124 is configured to hold a reticle 140. The spinner 126 is configured to rotate the reticle holder 124 and the reticle 140 thereon. The casing 130 defines an accommodating space 136 which accommodates the reticle holder 124 and the spinner 126. The fluid generator 114 is configured to control a flow condition and a humidity condition in the casing 130 by generating a fluid flow to the accommodating space 136. In some embodiments, the fluid flow generated by the fluid generator 114 includes clean air with controlled humidity, such as a relative humidity of about 45% or above.

Figure 2A:
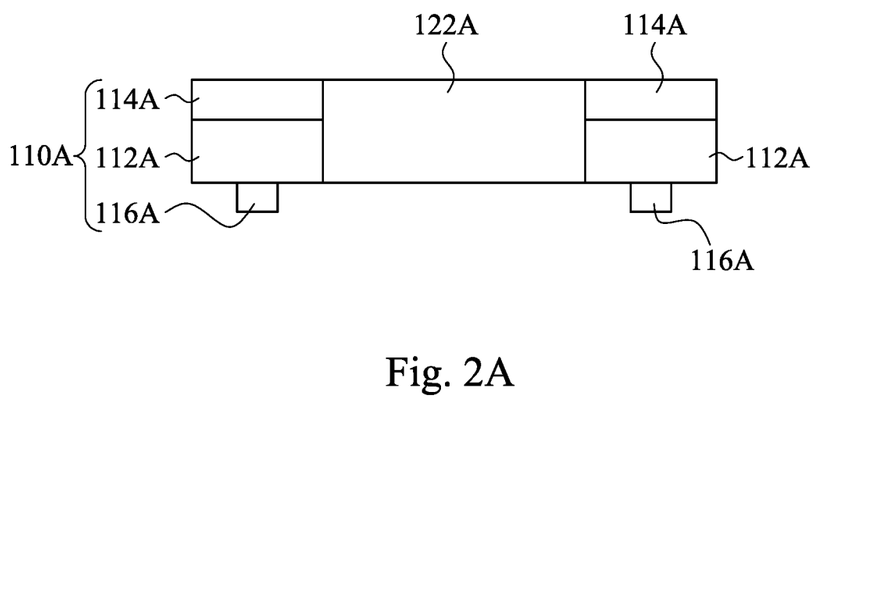
FIGS. 2A and 2B are schematic diagrams illustrating front-views of configurations of a liquid injector and a static charge reducing device in accordance with some embodiments of the present disclosure.
Figure 2B:
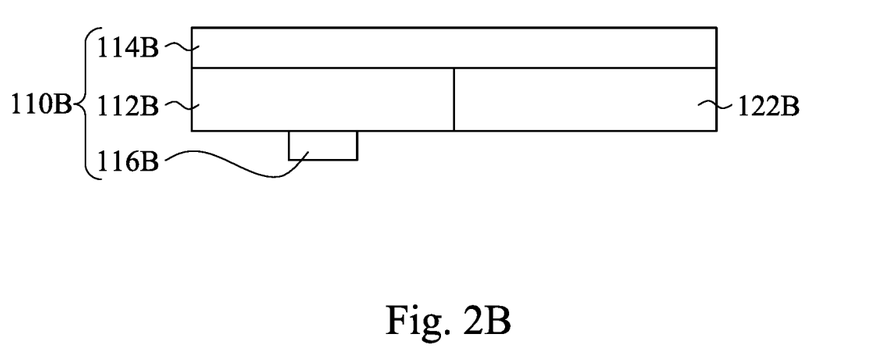

Reference is made to FIGS. 1, 2A, and 2B, wherein FIGS. 2A and 2B are schematic diagrams illustrating front-views of configurations of the liquid injector 122 and the static charge reducing device 110 in FIG. 1 in accordance with some embodiments of the present disclosure. With respect to relative positions of the static charge reducing device 110 and the liquid injector 122, a variety of configurations thereof illustrated in FIGS. 1, 2A, and 2B are described as follows.

As shown in FIG. 1, in some embodiments, the fluid generator 114, the ionizer 112, and the static charge sensor 116 are arranged in a sequence from top to bottom, i.e., the ionizer 112 is located below the fluid generator 114 and the static charge sensor 116 is located below the ionizer 112. The static charge reducing device 110 and the liquid injector 122 are both partially contained in the accommodating space 136. Hence, the fluid flow created by the fluid generator 114 may flow downwardly from the top of the accommodating space 136. When the fluid generator 114 functions, the fluid flow may continuously flow through the accommodating space 136 and components therein. In some embodiments, the liquid injector 122 is located adjacent to the ionizer 112 and the fluid generator 114. Due to the configuration of the liquid injector 122 and the static charge reducing device 110, the static charge reducing device 110 may move together with the liquid injector 122. Therefore, the static charge reducing device 110 may efficiently reduce static charges occurred on the reticle 140 and induced by the cleaning liquid injected by the liquid injector 122.

More specifically, when the liquid injector 122 injects the cleaning liquid onto an area of the reticle 140, the probability of the ESD occurrence may be substantially higher at the area because of a higher friction between the cleaning liquid and the reticle 140 as a result of accumulated cleaning liquid. Additionally, collisions between the cleaning liquid and the reticle 140 may also increase the probability of the ESD occurrence. Consequently, in some embodiments, since the static charge reducing device 110 may move together with the liquid injector 122, static charges occurred at the injected area of the reticle 140 may be instantaneously reduced. In some embodiments, the ionized air molecules created by the ionizer 112 may be guided by the fluid flow generated by the fluid generator 114 to move toward one or more desired areas on the reticle 140 for reducing static charges thereon.

In some embodiments, as shown in FIG. 2A, the static charge reducing device 110A includes the fluid generator 114A, the ionizer 112A, and the static charge sensor 116A arranged in a sequence from top to bottom. Two sets of the static charge reducing device 110A are respectively located at two sides of the liquid injector 122A. Due to the configuration above, the ionizers 112A, the fluid generators 114A and the static charge sensors 116A are evenly distributed, such that both the unit sensing area and the static charge reducing ability of the static charge reducing device 110A may be substantially enhanced. In some other embodiments, the fluid generator 114A and the ionizer 112A substantially surround sides of the liquid injector 122A while the static charge sensors 116A are symmetrically located below the ionizer 112A, i.e., the fluid generator 114A and the ionizer 112A are integrated as one piece and laterally enclosing the liquid injector 122A. Hence, the connection between the static charge reducing device 110A and the liquid injector 122A may be more stable.

In some embodiments, as shown in FIG. 2B, the fluid generator 114B is located at the uppermost position and covers the ionizer 112B, the static charge sensor 116B, and the liquid injector 122B. It is noted that the configurations shown in FIGS. 1, 2A, and 2B are for illustrative purposes, and should not limit the present disclosure. Embodiments fall within the present disclosure if the static charge reducing device 110B and the liquid injector 122 are above the reticle holder 124.

Reference is made back to FIG. 1. In some embodiments, the ionizer 112 of the static charge reducing device 110 is configured to release ionized air molecules, i.e., the positive air ions, the negative air ions, or the combination thereof, for reducing (or neutralizing) static charges on the target. In particular, the ionizer 112 ionizes air molecules, such as nitrogen, oxygen and/or hydrogen oxide, by applying high voltage thereto, such that a plurality of positive and negative air ions may be produced. The produced positive and negative air ions are subsequently released to cancel out corresponding static charges on the target, such as the reticle 140, for preventing the ESD occurrence thereon. For example, as illustrated in FIG. 1, some of the released positive ions are attracted by some of the negative ions on the reticle 140 while others of the released positive ions are repulsed by some of the positive ions accumulated on the same reticle 140, and vice versa.

In some embodiments, the fluid generator 114 of the static charge reducing device 110 includes a fan filter unit (FFU). The FFU is a type of motorized air conditioning equipment and may generate a fluid flow through the accommodating space 136. More specifically, the fluid generator 114 may filter out airborne particles and supply purified air to a space, such as the accommodating space 136 defined by the casing 130. Since the lithography process becomes more sophisticated, even one tiny particle on the reticle 140 may result in a noticeable defect on the semiconductor device and deteriorate the performance thereof. Due to the air filtering function of the fluid generator 114, the fluid generator 114 may help prevent particle-induced issues, such as pattern deformations on the semiconductor device. It should be noted that other suitable types of fluid generator are also within the contemplated scope of the present disclosure.

Moreover, the fluid generator 114 may also include a humidity controller which is connected with a vapor source, such that the amount of vapor may be controlled and provided to the fluid flow. Hence, the fluid generator 114 may control a flow condition and a humidity condition in the accommodating space 136. As shown in FIG. 1, the casing 130 of the reticle cleaning system 100 includes a pair of exhaust holes 132 located at the bottom portion thereof and a taper opening 134 at the upper portion thereof, i.e., the casing 130 resembles a cup surrounding components therein. More specifically, the fluid flow (illustrated as the curved arrows in FIG. 1) created by the fluid generator 114 may start from the taper opening 134, pass through the reticle holder 124 and the reticle 140, and leave the casing 130 via the exhaust holes 132. That is, the fluid flow is downwardly blown through the accommodating space 136. In some embodiments, the reticle holder 124 is located between the pair of exhaust holes 132, such that the fluid flow may evenly pass through the reticle 140 and the reticle holder 124. In some embodiments, the fluid generator 114 is substantially adjacent to the taper opening 134, such that the fluid flow may be mostly injected into the accommodating space 136. Hence, when the fluid generator 114 functions, the continuously blowing fluid flow may substantially form a flow field in the accommodating space 136, such that the fluid flow may dynamically surround the components in the accommodating space 136.

Additionally, the fluid generator 114 may also control a pressure condition and a humidity condition in the accommodating space 136. More specifically, suitable pressure and humidity conditions in the accommodating space 136 may be provided through the fluid flow. In some embodiments, the fluid generator 114 may provide the pressure and humidity conditions as those in a clean room, where the pressure and humidity conditions are about 0 pascal to about 500 pascals (e.g., about 300 pascals) and about 30% RH (also known as the relative humidity) to about 90% RH (e.g., about 45% RH) respectively.

Generally speaking, the probability of the electrostatic discharge (ESD) occurrence is inversely proportional to the value of the relative humidity. More specifically, when an object is positioned in a high relative humidity condition, conductive moisture may exist near the surface of the object to prevent the static charge accumulation. Therefore, static charges may not easily accumulate on the object and thus the probability of the ESD occurrence is decreased. On the other hand, among the reticle cleaning processes, the spin dry process is conducted in a condition with low relative humidity, such that the probability of the ESD occurrence therein is substantially high. Additionally, the threshold separating the high relative humidity and the low relative humidity herein is about 45% RH. Static charges are less likely to accumulate when the relative humidity exceeds about 45% RH. Hence, the ESD issue may be improved by providing a suitable relative humidity around the target object, such as the reticle 140. In some embodiments, the fluid generator 114 may keep the relative humidity of the accommodating space 136 within a predetermined range (e.g., about 45% to about 100% RH). In detail, when the relative humidity is below about 45% RH, a condition that is suitable for the static charge accumulation may be formed and the probability of the ESD occurrence therein may be substantially increased.

In some embodiments, the casing 130 includes the taper opening 134 at the upper portion thereof. As shown in FIG. 1, since the convergent shape of the taper opening 134 substantially decreases the opening area, the taper opening 134 may help restrain the external air from massively infiltrating into the accommodating space 136. Hence, the potential risk of particle contamination to the reticle 140 may be reduced. In some other embodiments, the opening at the upper portion of the casing 130 is directly defined by vertical sidewalls of the casing 130, i.e., the opening is not tapered based on various designs.

In some embodiments, as shown in FIG. 1, the reticle cleaning system 100 further includes humidity sensors 160. The humidity sensors 160 are respectively adjacent to the exhaust holes 132 and communicated with the fluid generator 114. When the fluid flow created by the fluid generator 114 leaves the casing 130 through the exhaust holes 132 and thus passes through the humidity sensors 160 near the exhaust holes 132, the humidity sensors 160 may analyze the relative humidity in the fluid flow and send a signal to the fluid generator 114, such that the fluid generator 114 may determine to adjust the relative humidity of the accommodating space 136 or not for decreasing the probability of the ESD occurrences therein. It should be noted that the configuration of the humidity sensor 160 may be changeable based on various designs, e.g., one of the humidity sensors 160 may be omitted.

In some embodiments, as shown in FIG. 1, the reticle cleaning system 100 further includes pressure sensors 170. The pressure sensors 170 are respectively adjacent to the exhaust holes 132 and communicated with the fluid generator 114. Similarly, the pressure sensors 170 may analyze the pressure condition of the casing 130 via the fluid flow and interact with the fluid generator 114, such that the fluid generator 114 may decide to adjust the pressure condition of the accommodating space 136 or not. It should be noted that the configuration of the pressure sensor 170 may be changeable based on various designs, e.g., one of the pressure sensors 170 may be omitted.

In some embodiments, as shown in FIG. 1, the static charge sensor 116 of the static charge reducing device 110 is configured to detect static charges on the reticle 140. More specifically, a static charge value on the reticle 140 may be precisely detected through analyzing the emitted and received electromagnetic waves (illustrated as the dotted lines in FIG. 1). Furthermore, when the static charge value on the reticle 140 is out of a predetermined range, the static charge sensor 116 may subsequently send a signal to the ionizer 112 and/or the fluid generator 114. Hence, the ionizer 112 may release ionized air molecules, such as positive air ions, negative air ions, or combinations thereof, toward the reticle 140 for reducing (or canceling out) the corresponding static charges. In some embodiments, the fluid generator 114 may simultaneously adjust the humidity condition of the accommodating space 136, e.g., the value of the relative humidity therein may be increased, for providing a condition that is not suitable for the static charge accumulation. In some embodiments, the static charge sensor 116 is one of various types of proximity sensors. However, it should be noted that the type of the static charge sensor 116 is not limited by the present embodiment, i.e., other types of sensors suitable for detecting static charges are also within the contemplated scope of the present disclosure. It should be also noted that the ionizer 112 and the fluid generator 114 may separately function based on various designs, e.g., the ionizer 112 or the fluid generator 114 can be selectively informed by the static charge sensor 116 and then function for reducing the static charge value on the reticle 140.

In some embodiments, as shown in FIG. 1, the liquid injector 122 of the reticle cleaning device 120 is a deionized water (also known as DI water or DIW) injector. In particular, the deionized water is a type of water that is substantially free of mineral ions, such as positive ions like sodium, calcium, iron and copper, and negative ions like chloride and sulfate. Hence, the DIW is an appropriate cleaning liquid for rinsing the reticle 140 without bringing various ions thereto. It should be noted that the type of cleaning liquid used in the liquid injector 122 may be changeable based on various designs, e.g., a suitable aqueous solution may also be applied to the liquid injector 122 for tackling various stains on the reticle.

In some embodiments, as shown in FIG. 1, the reticle holder 124 of the reticle cleaning device 120 is a stage configured for supporting and fixing the reticle 140. More specifically, the cross section of the reticle holder 124 resembles a U-shaped structure with protrusions 1241 on the upper portion thereof. The protrusions 1241 are located near the upper portion of the reticle holder 124 and extend from the inner sidewalls 1242 thereof for supporting the bottom 1403 of the reticle 140. Hence, the protrusions 1241 and the inner sidewalls 1242 of the reticle holder 124 may clamp the reticle 140 like claws, such that the reticle 140 may be firmly fixed by the reticle holder 124. In some embodiments, the protrusions 1241 and the sidewalls 1242 of the reticle holder 124 are configured to collectively clamp corners of the reticle 140. In some other embodiments, the protrusions 1241 and the sidewalls 1242 of the reticle holder 124 are configured to collectively clamp corners and sides of the reticle 140. Hence, the reticle holder 124 may fix the reticle 140 by clamping various portions of the reticle 140. It should be noted that the configuration of the reticle holder 124 may be changeable based on various designs, e.g., the sidewalls 1242 of the reticle holder 124 may enclose the sides 1402 of the reticle 140. It should be further noted that the relative position of the reticle 140 and the reticle holder 124 may be adjustable based on various designs, e.g., the top surface of the reticle holder 124 may be lower than the top surface 1401 of the reticle 140.

In some embodiments, the spinner 126 of the reticle cleaning device 120 is a rotatable component connected with the reticle holder 124 and configured to rotate the reticle holder 124 and the reticle 140 fixed thereon. More specifically, the centrifugal force created by the spinner 126 may be applied to the cleaning liquid on the reticle 140. Hence, the reticle cleaning processes, such as the cleaning liquid dispensing process and the spin dry process, may be conducted.

In some embodiments, as shown in FIG. 1, the reticle cleaning system 100 further includes a conductive frame 150. The conductive frame 150 is grounded and electrically connected between the reticle 140 and the ground G through the casing 130, such that static charges accumulated on the reticle 140 may be released to the ground G. In some embodiments, the conductive frame 150 is in direct contact with the bottom 1403 and the sides 1402 of the reticle 140, such that the static charges thereon may be directly moved out to the ground G. In some embodiments, the conductive frame 150 surrounds the bottom 1403 and the sides 1402 of the reticle 140. In some other embodiments, the conductive frame 150 covers a portion of the bottom 1403 and the sides 1402 of the reticle 140 and also exposes the other portion of the bottom 1403 and the sides 1402 of the reticle 140. On the other hand, since the reticle 140 includes insulating materials that have bad conductivities to release static charges thereon, the configuration of the conductive frame 150 may effectively figure out the conductive problem by direct contacting the static charges for quickly taking away the static charges on the reticle 140 to the ground G.

Figure 3A:
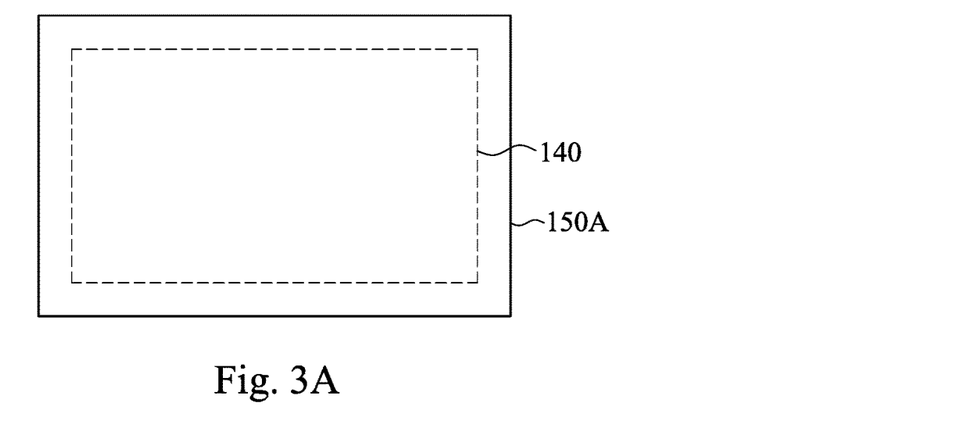
FIGS. 3A to 3C are schematic diagrams illustrating a shape of a conductive frame viewed from a bottom direction normal to and toward a bottom surface thereof in accordance with some embodiments of the present disclosure.
Figure 3B:
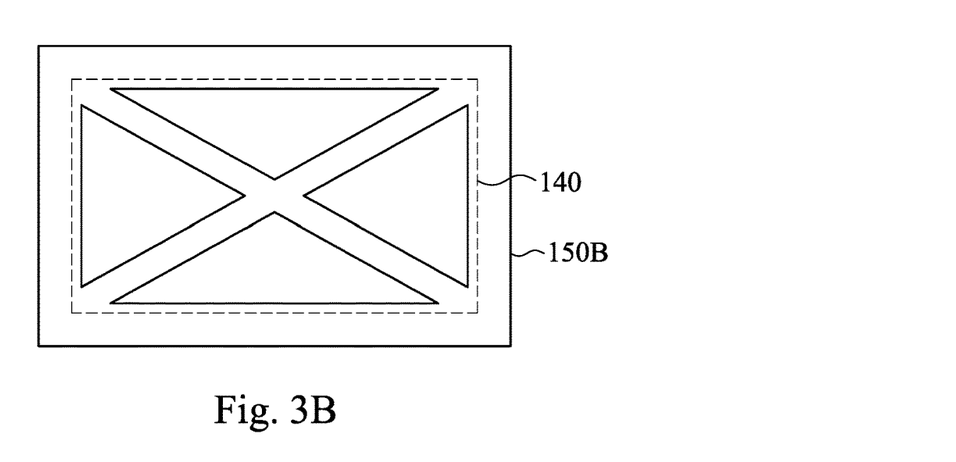
Figure 3C:
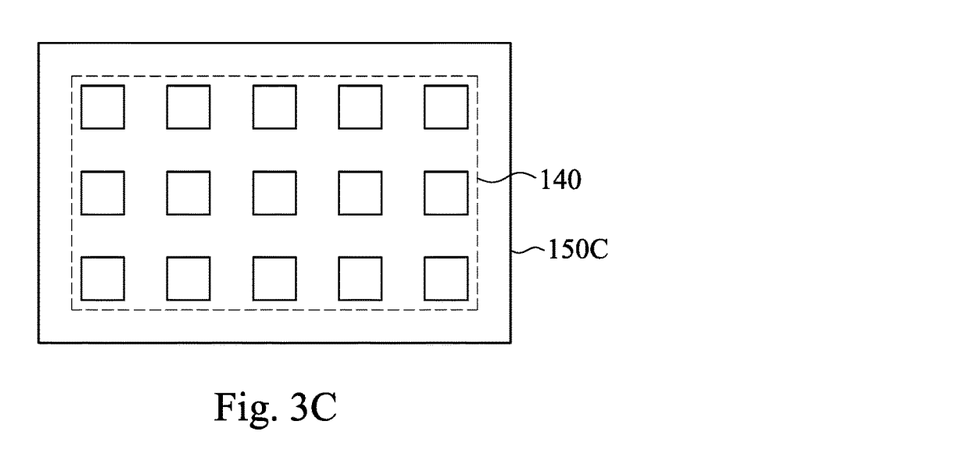

Reference is made to FIGS. 3A to 3C, which are schematic diagrams illustrating a shape of a conductive frame 150 viewed from a bottom direction normal to and toward a bottom surface thereof in accordance with some embodiments of the present disclosure. In some embodiments, as shown in FIG. 3A, the shape of the conductive frame 150A viewed from the bottom direction substantially resembles a rectangle. In some embodiments, as shown in FIG. 3B, the shape of the conductive frame 150B viewed from the bottom direction resembles a diagonal. In detail, the conductive frame 150B has a cross-shaped contact area with triangular hollows therebetween. In some embodiments, as shown in FIG. 3C, the shape of the conductive frame 150C viewed from the bottom direction resembles a grid. In detail, the conductive frame 150C has a net-shaped contact area with rectangular hollows therebetween. Due to the configurations above, the conductive frame 150A may contact the bottom 1403 of the reticle 140. Additionally, the various hollows of the conductive frames 150B and 150C may expose various areas of the bottom 1403 of the reticle 140 based on various designs. Hence, the fluid flow created by the fluid generator 114 may also pass through the exposed areas.

In some embodiments, as shown in FIG. 1, the reticle cleaning system 100 includes a lid 180 covering the opening at the upper portion of the casing 130. The cross section of the lid 180 substantially resembles an inverse U shape. In some embodiments, the lid 180 has an inclined bottom surface 1801 that is correspondent with the upper portion of the casing 130, i.e., the inclined bottom surface 1801 of the lid 180 is substantially parallel to the top surface 1341 of the tapered opening 134. Hence, the lid 180 may fit the tapered opening 134 for isolating the accommodating space 136 and components therein from the exterior. Additionally, the lid 180 is movably connected with the casing 130 along a direction 1802. It should be noted that both the shape of the lid 180 and the bottom surface 1801 thereof may be changeable based on various designs, e.g., the cross section of the lid 180 may resemble a hemisphere.

Figure 4:
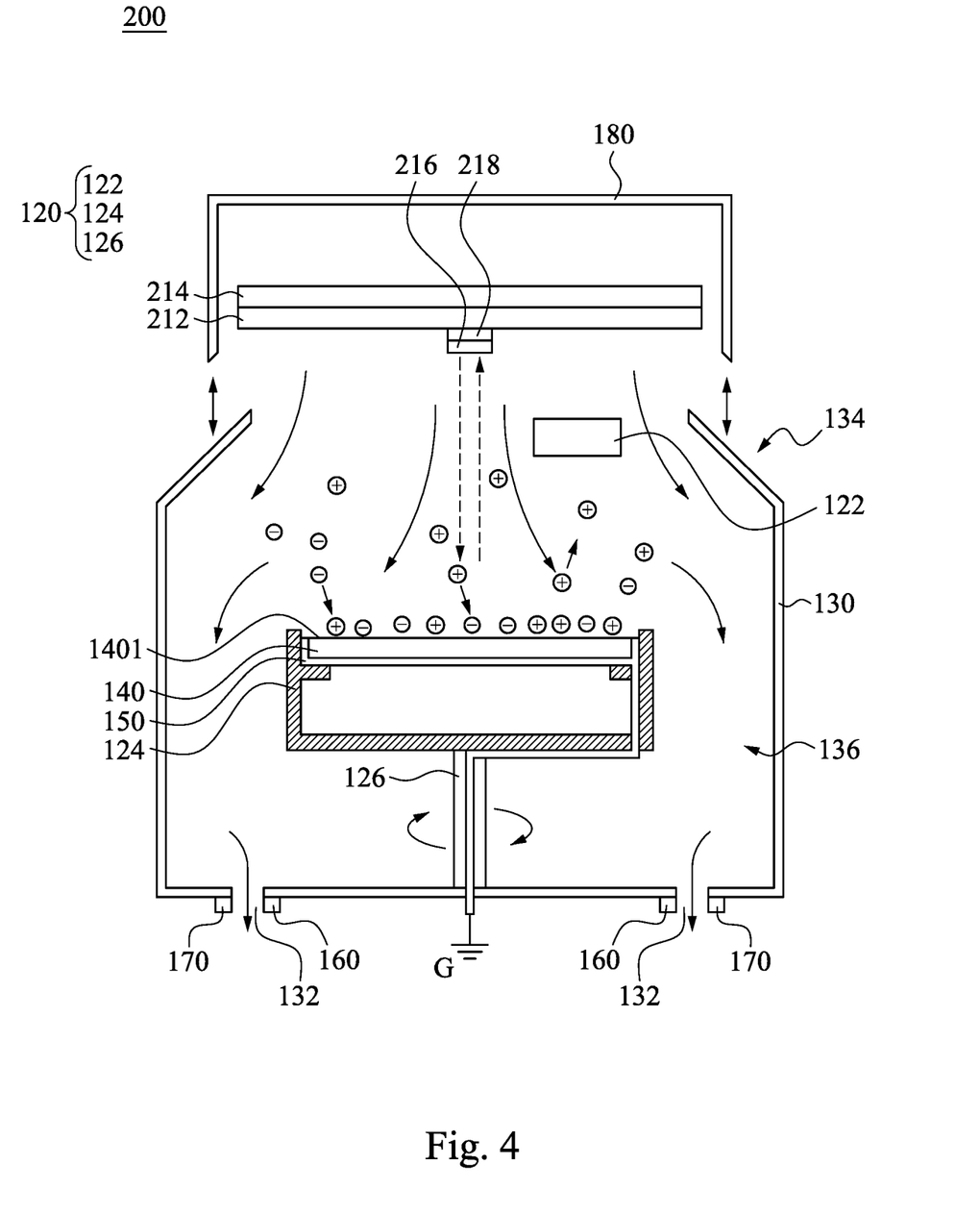
FIG. 4 is a schematic diagram illustrating a front-view of a reticle cleaning system with static charge detecting and removing functions in accordance with some other embodiments of the present disclosure.

Reference is made to FIG. 4, which is a schematic diagram illustrating a front-view of a reticle cleaning system 200 in accordance with some other embodiments of the present disclosure. Since some components shown in FIG. 4 are similar to those corresponding components of FIG. 1, descriptions for those similar components will not be repeated hereinafter.

In some embodiments, as shown in FIG. 4, the liquid injector 122 is separated from the ionizer 212 and the fluid generator 214. Hence, the ionizer 212 and the fluid generator 214 may be stationary while the liquid injector 122 is movable to rinse the reticle 140. Additionally, when the static charge sensor 216 sends a signal indicating that the static charge value on the reticle 140 is out of a predetermined range, the ionized air molecules created by the ionizer 212 may be blown to the substantially entire area of the reticle 140 at a time through the fluid flow produced by the fluid generator 214. In some other embodiments, the ionized air molecules may also be particularly guided to one or more desired areas of the reticle 140 at a time by controlling the fluid flow, such that the static charge reducing performance may be enhanced.

In some embodiments, the static charge sensor 216 may be located below and at the middle of the ionizer 212 when the static charge sensor 216 is rotatable for having various sensing directions or has a wide sensing area at a time, such that the substantially entire top surface 1401 of the reticle 140 may be sufficiently detected. In some other embodiments, the static charge sensor 216 is movable through a motor 218 with respect to the ionizer 212, such that the static charge sensor 216 may arbitrarily move above the reticle 140 to detect static charge.

Figure 5:
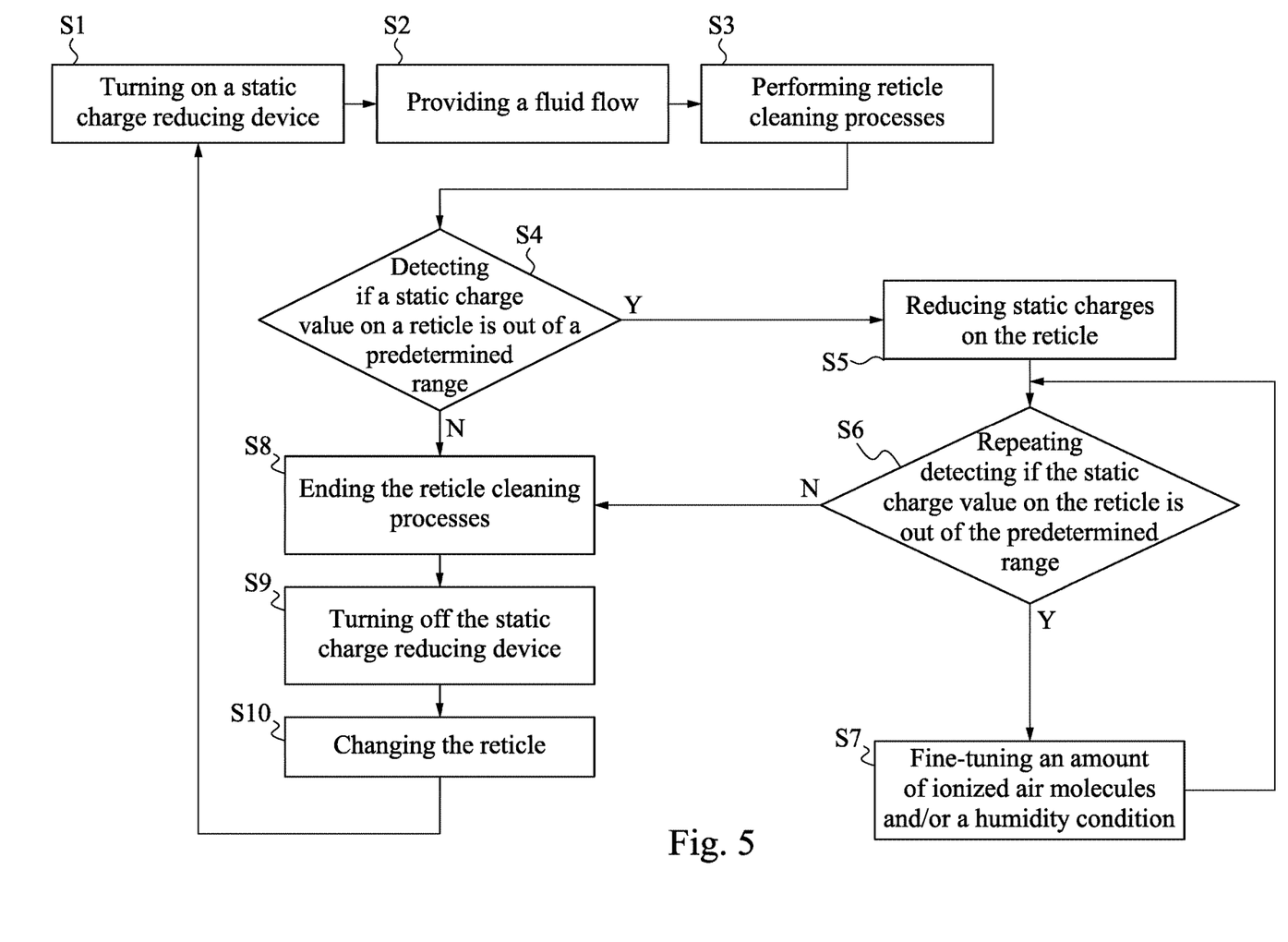
FIG. 5 is a flow chart illustrating a method for controlling a reticle cleaning system with static charge detecting and removing functions in accordance with some embodiments of the present disclosure.

Reference is made to FIG. 5, which is a flow chart illustrating a method for controlling a reticle cleaning system with static charge detecting and removing functions in accordance with some embodiments of the present disclosure. For illustration purposes, the reticle cleaning system 100 of FIG. 1 is referenced to collectively describe the details of the method as follows. The method is merely an example, and is not intended to limit the present disclosure beyond what is explicitly recited in the claims. Additional operations can be provided before, during, and after the method, and some operations described can be replaced, eliminated, or moved around for additional embodiments of the process. For clarity and ease of explanation, some elements of the figures have been simplified.

The operation S1 is performed for turning on the static charge reducing device 110. Hence, the static charge reducing device 110 may be ready prior to the reticle cleaning processes. For example, the ionizer 112, the fluid generator 114, and the static charge sensor 116 of the static charge reducing device 110 are turned on to be ready for reducing the static charges on a reticle 140 during the following reticle cleaning processes. It should be noted that the reticle 140 may be placed on the reticle holder 124 prior to or after turning on the static charge reducing device 110 based on various designs.

The operation S2 is performed for providing a fluid flow. More specifically, the fluid generator 114 may provide the fluid flow from the taper opening 134 of the casing 130 down to the exhaust holes 132 of the casing 130, such that the fluid generator 114 may form a flow field through the accommodating space 136 by the continuously blowing fluid flow. Hence, the fluid flow may dynamically surround the components in the accommodating space 136 during the cleaning processes. On the other hand, in some embodiments, the fluid generator 114 may also adjust the humidity condition in the casing 130 at the same time when the fluid flow is provided. In detail, the fluid generator 114 may adjust the humidity condition in the casing 130 in collaboration with the humidity sensors 160, such that the humidity condition may be maintained within a suitable range (e.g., about 45% to about 100% RH) for providing various advantages as described above. Additionally, in some other embodiments, the fluid generator 114 may further adjust the pressure condition in the casing 130 simultaneously to form a clean room environment in the casing 130.

The operation S3 is performed for performing the reticle cleaning processes, such as the cleaning liquid dispensing process and the spin dry process. For example, the cleaning liquid dispensing process includes providing a cleaning liquid to the reticle 140 while the reticle 140 is rotated, and the spin dry process includes rotating the reticle to dry the reticle 140. More specifically, the reticle 140 is placed on the reticle holder 124 for the following reticle cleaning processes. The bottom 1403 and the sides 1402 of the reticle 140 are in contact with the conductive frame 150 that is grounded. Hence, static charges on the bottom 1403 and the sides 1402 of the reticle 140 may be discharged to the ground G. After the reticle 140 is fixed by the reticle holder 124, the reticle 140 is subsequently rotated. In some embodiments, since the ESD may occur during the reticle cleaning processes, the static charge reducing device 110 may be turned on prior to the reticle cleaning processes, such that possible ESD issues during the reticle cleaning processes may be instantaneously tackled.

The operation S4 is performed for detecting if a static charge value on the reticle 140 is out of a predetermined range. More specifically, the static charge sensor 116 may actively detect the top surface 1401 of the reticle 140 through various means as described above to sense the static charge value thereof. In some embodiments, detecting the reticle 140 may include moving the static charge sensor 116 for detecting the static charge value on the reticle 140, e.g., the static charge sensor 116 may be moved via the liquid injector 122 or a motor connected thereto. Hence, if the static charge value is out of a predetermined range, the static charge sensor 116 may subsequently inform the ionizer 112 and/or the fluid generator 114 for the following operations. In some embodiments, the predetermined range may be about −500V to about 500V. If the detected static charge value is out of the predetermined range, the static charges are considered too high, and the patterns on the reticle 140 may be damaged by the ESD occurred thereto. On the other hand, if the detected static charge values during the reticle cleaning processes are within the predetermined range, the operation S8 may be subsequently conducted to end the reticle cleaning processes.

The operation S5 is performed for reducing static charges on the reticle 140, i.e., lowering the detected static charge value on the reticle 140 sensed in the operation S4. More specifically, in some embodiments, the ionizer 112 may release ionized air molecules, such as positive air ions, negative air ions, or combinations thereof, toward the reticle 140, such that the corresponding static charges on the reticle 140 may be subsequently canceled out. In some embodiments, the ionized air molecules may go along with the fluid flow created by the fluid generator 114 to evenly pass through the reticle 140 or particularly direct to one or more desired areas of the reticle 140. Hence, the fluid generator 114 may make the fluid flow particularly direct to the area of the reticle 140 where the static charge value is considered as too high. In some other embodiments, the fluid generator 114 may adjust the humidity condition of the accommodating space 136, e.g., the humidity condition thereof may be increased, for lowering the probability of the ESD occurrence. It should be noted that the ionizer 112 and the fluid generator 114 may separately function based on various designs, e.g., the ionizer 112 or the fluid generator 114 can be selectively informed by the static charge sensor 116 and then function for lowering the static charge value on the reticle 140.

The operation S6 is performed for repeating detecting if the static charge value on the reticle 140 is out of the predetermined range. More specifically, after the operation S5 of reducing the static charges on the reticle 140, the detection herein is an additional checking procedure conducted to examine whether the static charge value is still out of the predetermined range. If the static charge value is still out of the predetermined range, fine-tuning operations may be subsequently conducted for lowering the static charge value on the reticle 140. Conversely, if the static charge value is within the predetermined range, the operation S8 may be conducted to end the reticle cleaning processes when the detected static charge values during the reticle cleaning processes are within the predetermined range.

The operation S7 is performed for fine-tuning the amount of the ionized air molecules toward the reticle 140 released from the ionizer 112 and/or the humidity condition of the accommodating space 136. More specifically, if the detected static charge value is still out of the predetermined range in the operation S6, the ionizer 112 may be informed to adjust the amount of the ionized air molecules for further removing the static charges on the reticle 140, e.g., the amount of the ionized air molecules may be increased. In some other embodiments, the ionizer 112 may adjust the ratio of positive and negative air ions in response to the detected static charge value from the static charge sensor 116. On the other hand, the combination of operations S6 and S7 may substantially establish an additional ESD solving loop for ensuring that the static charges on the reticle 140 may be successfully reduced and thus the static charge value may be within the predetermined range.

Additionally, the operation S7 may be also performed for fine-tuning the humidity condition in the casing 130. More specifically, the humidity condition of the accommodating space 136 may be further increased, e.g., to 50% RH or higher, for further lowering the probability of the ESD occurrence. In some embodiments, after the static charges on the reticle 140 are reduced, the humidity condition may be subsequently decreased, e.g., the humidity condition may be adjusted back to that after the operation S2. It should be noted that fine-tuning of the humidity condition and/or fine-tuning of the amount of the ionized air molecules may be selectively adopted based on various designs, e.g., either one of them may be conducted independently or both of them may be simultaneously conducted for enhancing the ESD preventing performance.

It should be noted that, during the reticle cleaning processes, the operation S4 is repeatedly conducted to detect the reticle 140 and then acquire a plurality of static charge values thereof. If any detected static charge value is out of the predetermined range, the operations S5 to S7 may be subsequently conducted to reduce the detected static charge value. Conversely, if the detected static charge values during the reticle cleaning processes are within the predetermined range, the operation S8 may be subsequently conducted.

The operation S8 is performed for ending the reticle cleaning processes. More specifically, after the cleaning liquid on the reticle 140 is substantially removed and the operation S4/S6 confirms that the detected static charge values on the reticle 140 are within the predetermined range, the reticle cleaning system 100 may stop rotating the reticle 140 and proceed with the next operation.

The operation S9 is performed for turning off the static charge reducing device 110. More specifically, the static charge reducing device 110 may stop detecting the static charge value on the reticle 140. The static charge reducing device 110 is turned off after the operation S8 of ending the reticle cleaning processes, such that it may be assured that the static charge value on the reticle 140 may not be increased by the reticle cleaning processes.

The operation S10 is performed for changing the reticle 140. More specifically, the cleaned reticle 140 is taken out of the casing 130. Subsequently, an unclean reticle will be placed in the casing 130 for the next reticle cleaning processes after the operations S1 and S2.

In some embodiments, the operations S1-S5 and S8-S10 may substantially form a method for controlling a reticle cleaning system with static charge detecting and removing functions. In other words, the adjustment of the initial humidity condition (selectively included in the operation S2), the repeating detecting the reticle (also known as the operation S6), and the fine-tuning the amount of ionized air molecules and/or the humidity condition (also known as the operation S7) may be substantially omitted or selectively adopted. For example, in some other embodiments, the additional ESD solving loop of operations S6 and S7 may be selectively merged into the method for further enhancing the ESD preventing performance through adjusting the ionized air molecules and/or the humidity condition in the casing.

The reticle cleaning system may effectively solve or minimize the electrostatic discharge (ESD) problem in the reticle cleaning processes, especially during the spin dry process, through three main manners. Firstly, the reticle cleaning system may adjust the humidity condition in the casing by the fluid generator. More specifically, the reticle cleaning system may help maintain a humidity condition within a predetermined range (e.g., about 45% to about 100% RH) in the casing where the static charges are less likely to accumulate on the reticle. Secondly, due to the configuration of the conductive frame, the bottom and the sides of the reticle are in direct contact with the conductive frame, such that the static charges on the bottom and the sides of the reticle may be directly moved out to the ground. Thirdly, the reticle cleaning system may actively detect a static charge value on the reticle and then reduce the detected static charge value through ionized air molecules released by the ionizer and/or the humidity adjustment by the fluid generator.

In some embodiments, a method for cleaning a reticle includes rotating the reticle, providing a cleaning liquid to clean the reticle, detecting a static charge value on the reticle during rotating the reticle, and reducing static charges on the reticle in response to the detected static charge value.

In some embodiments, a method for removing static charges on a reticle includes placing the reticle on a reticle holder in a casing, rotating the reticle by a spinner, detecting a static charge value of a top surface of the reticle by at least one static charge sensor, and releasing ionized air molecules toward the top surface of the reticle by an ionizer when the static charge value is out of a predetermined range.

In some embodiments, a reticle cleaning system includes a casing, a reticle holder in the casing and configured to hold a reticle, and a static charge reducing device above the reticle holder. The static charge reducing device includes an ionizer configured to provide ionized air molecules to the reticle and at least one static charge sensor communicated with the ionizer and configured to detect a static charge value on the reticle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a reticle comprising:
   rotating a reticle;
   moving an ionizer along with a static charge sensor toward the reticle;
   a discharging cleaning liquid onto the reticle;
   detecting, by the static charge sensor, a static charge value on the reticle during rotating of the reticle; and
   reducing, by the ionizer, static charges on the reticle in response to the detected static charge value, wherein during the step of reducing static charges, the ionizer is located over the static charge sensor and vertically overlaps the static charge sensor.

2. The method of claim 1, wherein reducing the static charges on the reticle comprises:
providing ionized air molecules toward the reticle, wherein the ionized air molecules include positive air ions, negative air ions, or a combination thereof.

3. The method of claim 2, further comprising repeating detecting the static charge value on the reticle and reducing the static charges on the reticle in response to the detected static charge value.

4. The method of claim 1, wherein reducing the static charges on the reticle comprises:
increasing a humidity of a casing accommodating the reticle.

5. The method of claim 4, further comprising:
decreasing the humidity after reducing the static charges on the reticle.

6. The method of claim 1, further comprising:
adjusting a humidity in a casing before rotating the reticle, wherein the casing accommodates the reticle.

7. The method of claim 1, further comprising:
stopping rotating the reticle after reducing static charges on the reticle.

8. The method of claim 7, further comprising:
stopping detecting the static charge value of the reticle after stopping rotating the reticle.

9. A method for removing static charges on a reticle comprising:
placing the reticle on a reticle holder in a casing;
rotating the reticle by a spinner;
detecting a static charge value of a top surface of the reticle by at least one static charge sensor; and
releasing ionized air molecules toward the top surface of the reticle by an ionizer when the static charge value is out of a predetermined range, wherein during the step of releasing ionized air molecules, the ionizer is located over the static charge sensor and vertically overlaps the static charge sensor.

10. The method of claim 9, wherein placing the reticle on the reticle holder comprises contacting the reticle with a conductive frame on the reticle holder, and the conductive frame is grounded.

11. The method of claim 10, wherein the conductive frame is in contact with a bottom of the reticle.

12. The method of claim 9, further comprising:
providing a fluid flow into the casing by a fluid generator, wherein the casing accommodates the reticle.

13. The method of claim 12, wherein releasing the ionized air molecules comprises:
guiding the ionized air molecules to move toward an area on the top surface of the reticle via controlling the fluid flow by the fluid generator.

14. The method of claim 12, further comprising:
adjusting a humidity through the fluid flow provided by the fluid generator before rotating the reticle.

15. The method of claim 9, wherein detecting the static charge value comprises:
moving the static charge sensor.

16. A method for removing static charges on a reticle comprising:
placing the reticle on a reticle holder in a casing;
moving a liquid injector toward the reticle;
controlling a humidity condition or a pressure condition in the casing;
dispensing, by the liquid injector, a cleaning liquid onto the reticle;
detecting, by a static charge sensor, a static charge value of a top surface of the reticle; and
releasing ionized air molecules toward the top surface of the reticle by an ionizer when the static charge value is out of a predetermined range, wherein during the step of releasing ionized air molecules, the ionizer is located over the static charge sensor and vertically overlaps the static charge sensor.

17. The method of claim 16, wherein controlling the humidity condition or the pressure condition in the casing comprises providing a fluid flow by a fluid generator into the casing.

18. The method of claim 16, wherein the humidity condition or the pressure condition in the casing is adjusted according to a detect signal produced by a humidity sensor or a pressure sensor which is used to detect a fluid flow exhausted from the casing.

19. The method of claim 16, wherein controlling the humidity condition or the pressure condition in the casing is performed after releasing the ionized air molecules toward the top surface of the reticle by the ionizer.

20. The method of claim 16, wherein the air molecules comprise a plurality of positive air ions and a plurality of negative air ions, or a combination thereof.

* * * * *